(12) United States Patent
O'donncha et al.

(10) Patent No.: US 11,080,141 B2
(45) Date of Patent: Aug. 3, 2021

(54) AUTOMATIC RESTARTING AND RECONFIGURATION OF PHYSICS-BASED MODELS IN EVENT OF MODEL FAILURE

(71) Applicant: International Business Machines Corporation, Armonk, NY (US)

(72) Inventors: Fearghal O'donncha, Mulhuddart (IE); Ernesto Arandia, Yorktown Heights, NY (US); Eli Michael Dow, Yorktown Heights, NY (US); Frank Liu, Austin, TX (US); Campbell D Watson, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 163 days.

(21) Appl. No.: 16/253,267

(22) Filed: Jan. 22, 2019

(65) Prior Publication Data
US 2020/0233747 A1 Jul. 23, 2020

(51) Int. Cl.
*G06F 11/14* (2006.01)
*G06F 30/20* (2020.01)

(52) U.S. Cl.
CPC ...... *G06F 11/1438* (2013.01); *G06F 11/1471* (2013.01); *G06F 30/20* (2020.01); *G06F 2201/82* (2013.01); *G06F 2201/84* (2013.01)

(58) Field of Classification Search
CPC .. G06F 11/1438; G06F 11/1471; G06F 30/20; G06F 2201/82; G06F 2201/84
See application file for complete search history.

(56) References Cited

U.S. PATENT DOCUMENTS

| 5,146,460 | A  | * | 9/1992  | Ackerman  | G06F 11/261 714/33 |
| 6,983,234 | B1 | * | 1/2006  | Hangal    | G06F 30/33 703/14  |
| 7,962,483 | B1 | * | 6/2011  | Thomas    | G06N 5/025 707/736 |
| 8,756,042 | B2 |   | 6/2014  | Tan et al.|                    |
| 8,856,756 | B2 |   | 10/2014 | Philipp et al. |               |

(Continued)

OTHER PUBLICATIONS

Mel, et al. "The NIST Definition of Cloud Computing". Reccomendations of the National Institute of Standards and Technology, Nov. 16, 2015.

*Primary Examiner* — Yolanda L Wilson
(74) *Attorney, Agent, or Firm* — Joseph Petrokaitis, Esq.; McGinn I.P. Law Group, PLLC.

(57) ABSTRACT

A simulation model recovery method, system, and computer program product include initiating a simulation model, during an operation of a model, periodically writing a solution space of the model to a checkpoint restart file, during an operation of the model, periodically writing diagnostic information on model progression to a log file, detecting a failure of the model, based on the log of the model, determining a time of the failure, based on the model outputs and restart files, determining a period of a numerical instability preceding the failure, selecting a checkpoint of the model preceding the period of the numerical instability, based on the numerical instability and diagnostic information in log files, modifying a configuration of the model, and restarting the model based on the selected checkpoint and the modified configuration.

20 Claims, 6 Drawing Sheets

(56) References Cited

U.S. PATENT DOCUMENTS

| | | |
|---|---|---|
| 9,262,560 B2 | 2/2016 | Hayder et al. |
| 2013/0110490 A1* | 5/2013 | Letz .................... G06F 11/2242 703/21 |
| 2014/0281743 A1* | 9/2014 | Hayder ................... E21B 49/00 714/48 |
| 2016/0299834 A1* | 10/2016 | Tomizawa .......... G06F 11/1469 |
| 2016/0342478 A1* | 11/2016 | Frye ........................ G06F 11/36 |
| 2017/0078442 A1* | 3/2017 | Pacella ............... H04L 67/1008 |
| 2018/0095619 A1 | 4/2018 | Liu et al. |

* cited by examiner

AUTOMATIC RESTARTING AND RECONFIGURATION OF PHYSICS-BASED MODELS IN EVENT OF MODEL FAILURE

BACKGROUND

The present invention relates generally to a simulation model recovery method, and more particularly, but not by way of limitation, to a system, method, and computer program product for allowing the automatic restarting of a failed model (e.g., due to a numerical or an algorithmic instability, a hardware failure, a human manipulation failure, etc.) based on a checkpoint-restart mechanism autonomously integrated with an online monitoring tool.

Physics-based models forced by highly variable boundary conditions (e.g. wind speeds, oceanic conditions, air pressure, temperature, etc.) are subject to many rapid changes in a state that can cause a model instability and a crash.

Conventionally, many modern simulation codes are extremely complex. The simulation codes combine different features such as complex mesh configurations, multi-physics algorithms, multiple resolutions, etc. These codes are often a part of a model stack of a number of coupled models which feed input data and boundary conditions to each other. Data assimilation, simulation, and analysis, that often depends on external data files are coupled into complex workflows. This makes model configurations susceptible to incorrect configurations due to human error; model simulations dependent on provision of all required datasets from external sources (e.g. from external models in the case of model coupling, or from sensor data sources in the case of data assimilation); and sensitive to development of excessive computational gradients due to combination of high resolution meshes, complex physics and nonlinear forcings that produce numerical instability. All these factors can lead or contribute to a model exit (i.e., a failure, crash, etc.) with defined (often domain or model specific) error codes. A standard approach to enable recovery from model exist is the periodic writing of restart files. This mechanism is often referred to as checkpoint restart mechanism. However, this still requires significant user interaction to analyze log files on model diagnostic and model compute outputs and checkpoint outputs, to identify the cause of the model crash and amend input and configuration files to restart the model with appropriate configurations.

The conventional issues are compounded if the model is a part of a model chain (i.e. coupled models). In other words, one model failure (unless appropriately restarted) leads to multiple coupled models not completing.

SUMMARY

In view of the newly-identified problems in the art, the inventors have considered an improvement that includes a technique to interrogate checkpoint restart and log files to identify a cause of a failure and edit the input files with amended simulation conditions to restart the model. Further, the technique integrates with machine learning approaches to identify the failure causes and to guide future restart configurations (e.g. to guide the frequency at which checkpoint restart files are written, to collect and analyse metrics on failure causes).

In an exemplary embodiment, the present invention provides a computer-implemented simulation model recovery method, the method including initiating a simulation model, during an operation of the model, periodically writing a solution space of the model to a checkpoint restart file, outputting diagnostic information on model progression to a log file detecting a failure of the model based on a monitoring tool, analysing the log files of the model and extracting cause of model failure (optionally by using natural language processing capabilities), determining a time of the failure from the log files, analysing model simulation computations to determine any potential period of numerical instability preceding the failure, selecting a checkpoint of the model preceding the period of numerical instability, based on the numerical instability and identified time of numerical instability and failure, modifying a configuration of the model based on the identified cause of model failure, and restarting the model based on the selected checkpoint and the modified configuration.

One or more other exemplary embodiments include a computer program product and a system, based on the method described above.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

Figure 1:
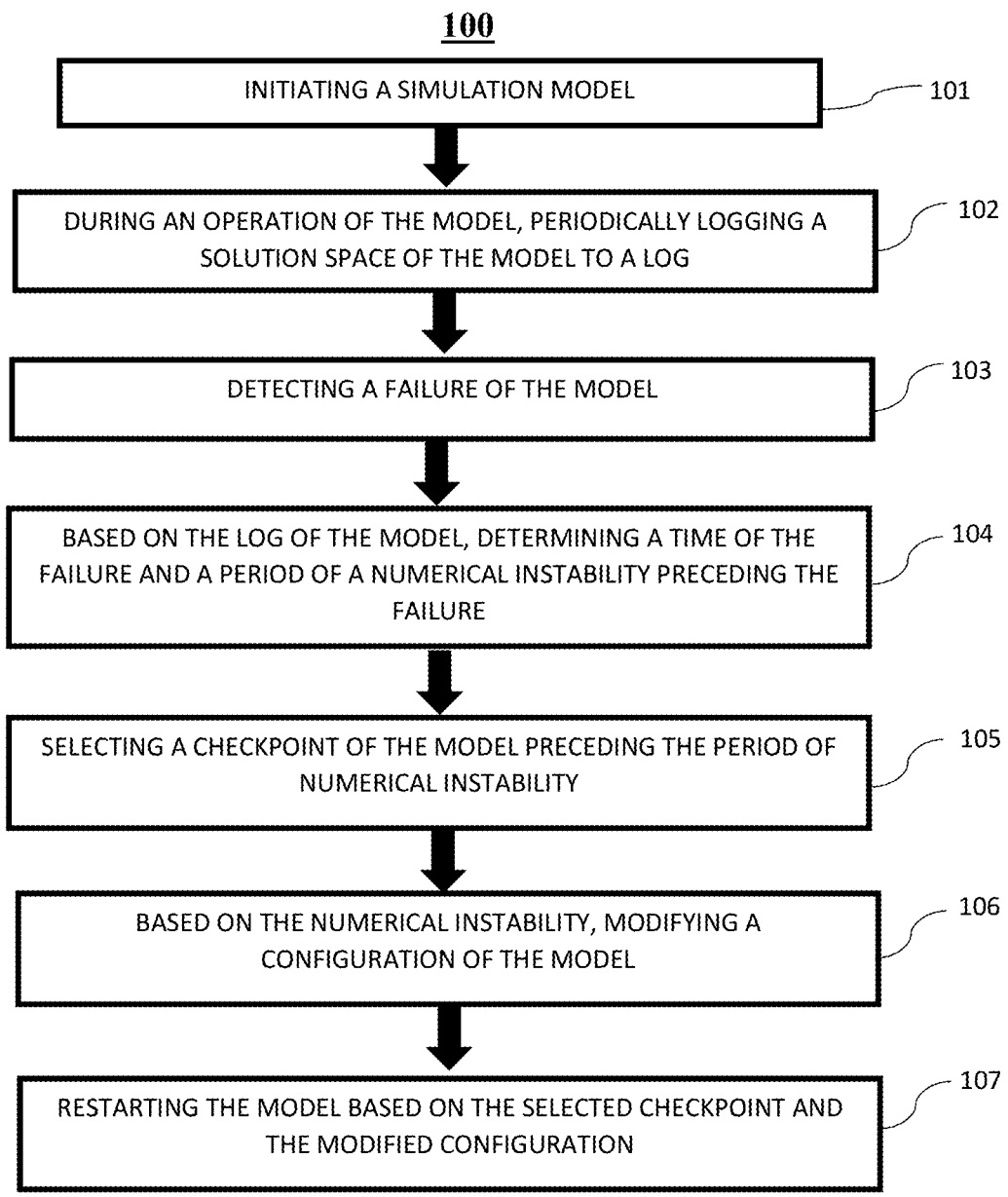
FIG. 1 exemplarily shows a high-level flow chart for a simulation model recovery method 100 according to an embodiment of the present invention.

The invention will now be described with reference to FIGS. 1-6, in which like reference numerals refer to like parts throughout. It is emphasized that, according to common practice, the various features of the drawings are not necessarily to scale. On the contrary, the dimensions of the various features can be arbitrarily expanded or reduced for clarity.

By way of introduction of the example depicted in FIG. 1, an embodiment of a simulation model recovery method 100 according to the present invention can include various steps for providing a more robust numerical simulation model(s) by combining text mining techniques (e.g., natural language processing (NLP), etc.) with analytics and machine learning algorithms to enable a model to be autonomously restarted and reconfigured in a response to a model failure.

Thus, the invention may increase a resiliency of a model, which is of utmost importance as models become more complex by incorporating multiple levels of physics and extremely high levels of precision. These increasing levels of complexity increases the demand on the user to provided larger volumes of configuration and input information and ensuring that the provided information is accurate and free from error. Also, the invention includes coupled-model stacks that may provide guarantees that individual models in a chain will run to conclusion even if a simulation time is longer (e.g., if a time step needs to be reduced to resolve certain temporal features) while removing a need for a user intervention in a case of a model crash.

Figure 4:
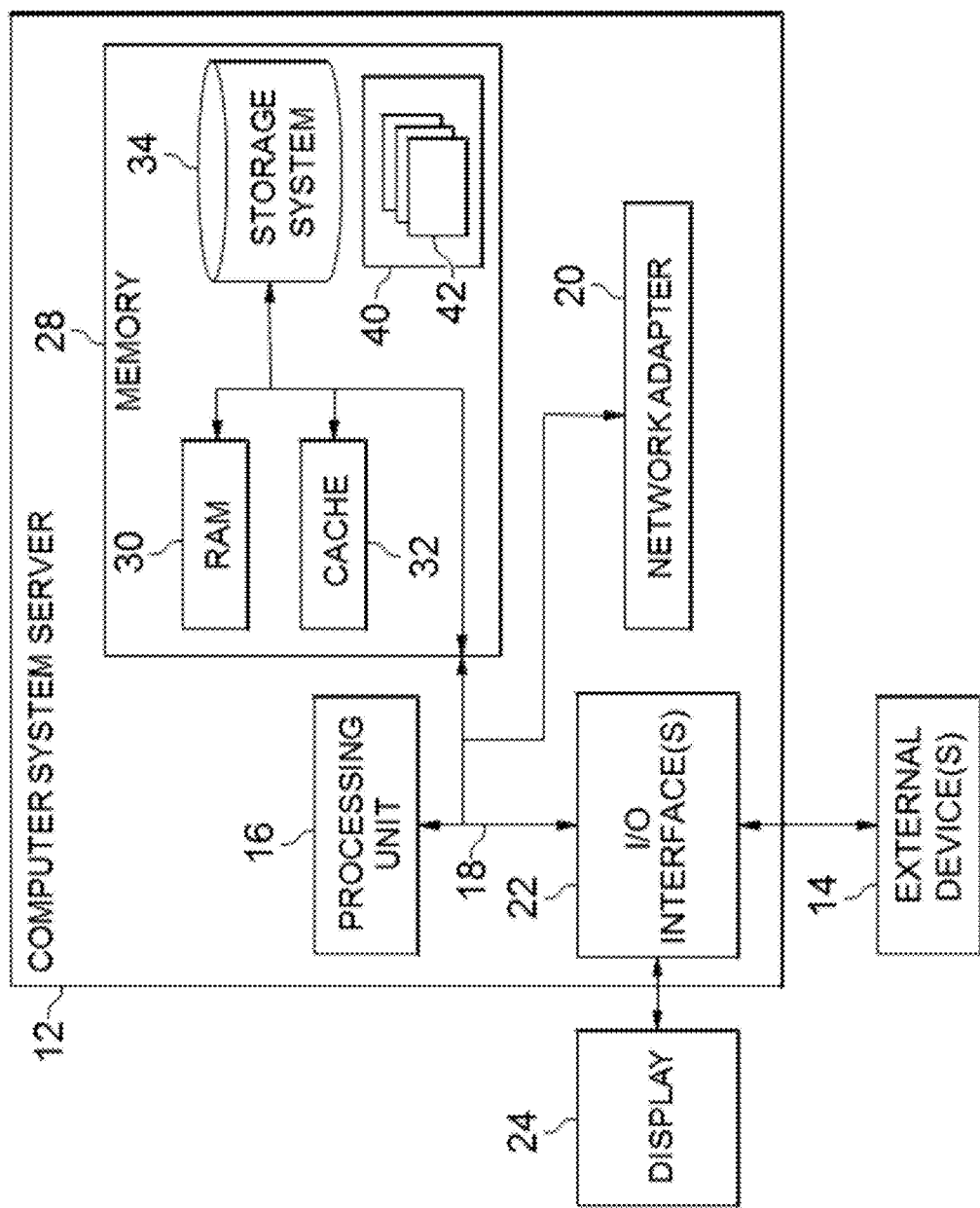
FIG. 4 depicts a cloud-computing node 10 according to an embodiment of the present invention.

By way of introduction of the example depicted in FIG. 4, one or more computers of a computer system 12 according to an embodiment of the present invention can include a memory 28 having instructions stored in a storage system to perform the steps of FIG. 1.

Although one or more embodiments may be implemented in a cloud environment 50 (e.g., FIG. 6), it is nonetheless understood that the present invention can be implemented outside of the cloud environment.

Figure 2:
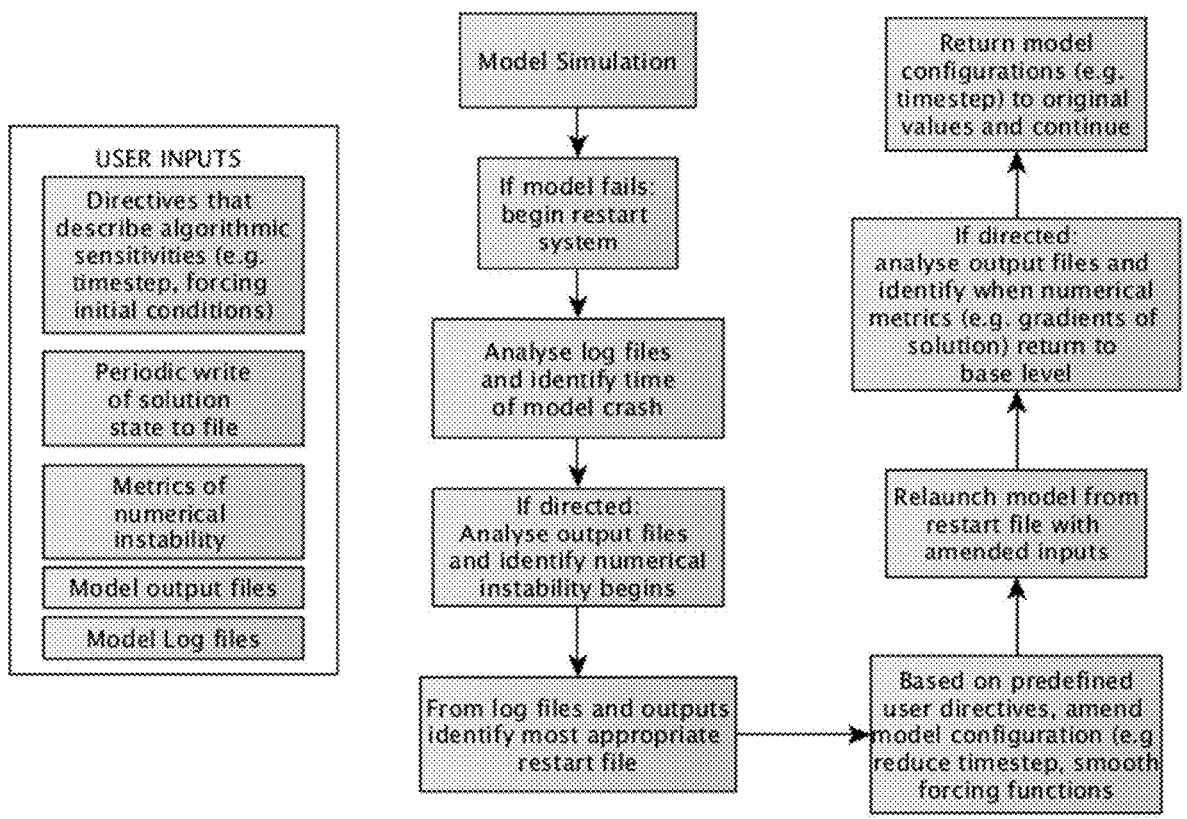
FIG. 2 exemplarily depicts a flow of the invention according to an embodiment of the present invention.
Figure 3:
FIG. 3 exemplarily depicts an exemplary model crash.

With reference to FIGS. 1-2, the method 100 automatically restarts physics-based simulation models (or the like) which exhibit an unsatisfactory operation by selecting a checkpoint of the model at regular time intervals and reconfiguring the simulation model input parameters. Further, the method 100 successfully recovers the simulation model by periodically writing a solution space of the model to a checkpoint restart file and writing diagnostic information to a log file or set of log files for detecting a failure (e.g., unplanned termination) of the model and determines a failure time of the model and a period of unsatisfactory operation preceding the simulation failure through an interrogation and monitoring of a data file (i.e., a log).

More specifically, in step 101, a simulation model is instantiated (i.e., initiated). In step 102, during an operation of the model, a solution space of the model is periodically logged to a checkpoint restart file. Together with this, information on the simulation (e.g. convergence properties, number of timesteps completed, stability properties, etc.) is written to a diagnostic log file.

In step 103, a failure of the model is detected. The failure may be complete termination or crash or partial failure such as model exhibiting large numerical instabilities, etc., And, in step 104, based on the log of the model, a time of the failure and a period of a numerical instability preceding the failure is determined.

In step 105, a checkpoint of the model preceding the period of numerical instability is selected. In step 106, based on the numerical instability and diagnostic information provided in the log file, a configuration of the model is modified. The model is restarted from this checkpoint period with amended configuration using the model solution space provided in the checkpoint restart file.

Then, in step 107, the model is restarted based on the selected checkpoint and modified configuration.

With reference back to FIG. 2 and step 104 of FIG. 1, the log can be analyzed to extract from the model log file information related to a cause of the model crash based on a defined ontology (e.g., "fatal error", non-zero exit code, etc.) using a model exit characterization component that collates information on the model failure. The identified exit code and the text description is related to the cause for the model failure accounting for different semantic uses across different domains using a defined ontology. First, a lexical matching is conducted to directly connect the exit code and the description to the cause of the model failure (e.g. "error: could not open file foo.inp"). Second, a semantic matching module relates the exit code to the cause of the model failure accounting for different conventions across domains (e.g. "time step exceeded" in some domains is replaced by "CFL restriction exceeded", "Fatal error", replaced by "Execution Failed", etc.).

Based on the above text mining and the semantic information extraction, the cause for the model failure is identified (and stored in a database of model failures to extract and learn information on failure patterns).

For the identified cause of the failure and the time of the model stop, a defined mitigation strategy is implemented (e.g., locate missing input data from additional source (e.g. instead of extracting sea surface temperature from "The Weather Channel" (TWC) portals, extract from secondary repository such as National Oceanic and Atmosphere Administration ((NOAA) datasets)).

Moreover, the model output files are interrogated and defined metrics of numerical stability are computed. As an example, the time series variogram and a standard deviation of the model computed flows are analyzed over time to identify the change rate. The appropriate restart time is identified based on when the change rate is less than a threshold (either user defined or based on a mean value). Then, the model is restarted from this identified time using the appropriate checkpoint/restart model state file (i.e., as in steps 105-107).

With reference to step 106 of FIG. 1, based on the identified cause of the model failure, the input files are amended to enable an effective restart of the model. The cause of the model failure is related to the specific input file parameters based on a similar semantic and a lexical matching approach as used for the log file analysis. For example, the invention may include relating a model failure due to "exceeding recommended time step" to amending input files by reducing a time step by 50%. Another example is relating the model failure due to "hydrostatic condition violation" to amending model vertical gradients such as bathymetry smoothing or density gradient smoothing. The identified mitigation strategy is implemented in order of a preference based on the text mining analysis of the log file conducted previously (e.g. reduce time step by 50%, increase number of iterations, apply smoothing filter to identified inputs (e.g. wind time series), etc.) These can be complemented (and expanded) by a domain ontology relating the causes of the model failure to the specific model configurations (for example provided by a domain expert).

Further, the invention may be complemented with machine learning approaches that learn the model failure causes and the associated remedial steps based on historical failures (i.e., the restart configurations will improve over time).

In one embodiment, a machine-learning model is trained on the database of stored model failures and the patterns to learn distinct patterns and related causes of the model failures and learn most appropriate restart configurations. Further, this can serve as part of a predictive failure module where the model configurations may be compared with the historical failure patterns to predict if, and when a model may fail. Thus, the invention can build up the database through machine learning identify errors in advance. This increases the resiliency of the model and can make the system predictive assisting the user in developing and configuring the models.

Indeed, the invention allows for the automatic restarting of a failed model based on a checkpoint-restart mechanism integrated with an autonomous online monitoring and a learning tool (i.e., without user interaction). For example, if a model is started on a system, typically a user must watch the model and debug and/or restart when an error occurs. However, the errors are typically trivial such as an input package not being received from a download. The invention may remove the user interaction with system by performing the adjustment of model configurations and extraction of appropriate input data files (e.g. atmospheric forcing data from TWC) and automatically restarting the model.

Thus, the invention provides an ability for a model to restart autonomously in a case of a crash, increases a model robustness to reach an end of a simulation time which is of particular importance when the model is part of a coupled stack (e.g. an atmospheric model forcing an ocean model), has the ability to store and apply machine learning techniques to the patterns of failure and computation of the cause/action based on the historical action, and provides a predictive failure by relating stored failure patterns with information on the model extracted from analyzing the configuration files and the online monitoring of output files (e.g. guide granularity of checkpoint/restart). For example, FIG. 3 exemplarily depicts a model failure in which a module was not uploaded into the model (i.e., surface air temperature input data).

In one embodiment, the invention may analyze past failures such as a particular module not being successfully downloaded when required by a model, alert the team running the model prior to the start time of the model, and fix the download such that the model receives each parameter required to run. That is, the invention may create a database for each failure and then predict future failures of the models based on the machine learning performed with the database date.

The invention may rely on a periodic checkpoint-restart mechanism that writes the solution space to a file, a text mining module that interrogates log files to identify the cause and time of model failure, a component that discovers variable names and values relevant to the models' input/output parameters based on user-defined directives, an analytics module to compute statistical descriptors of flow to identify appropriate restart time (e.g., variogram, vorticity, vertical gradients of flow, etc.), and directives to amend model configuration based on log file output.

In one embodiment, a storage module (e.g. a database) logs details on the model failure such as identified cause of the failure, the associated action, the nature of the failure (software, hardware, algorithmic/user configuration), etc.

In one embodiment, a learning and prediction module applies artificial intelligence to patterns of failure (e.g., frequency, nature, identified causes, etc.) to develop predictive failure and mitigation strategies.

As shown in FIG. 2, inputs for the method 100 include inputs of user directives on model stability sensitivities (e.g., availability of all required input data (True/False), potential time step violations, large forcing variations, sharp gradients in computed variables, variance bounds of outputs, etc.), model parameters such as a complex large scale model (e.g., a weather model, a financial model, a computational fluid dynamic (CFD) model, etc.) which maps inputs (e.g., initial conditions, boundary conditions, etc.) to some desired information on the system (precipitation rate, future price, aerodynamic effects, etc.), the output files including a solution state of the model written to a file at a user-defined spatial and temporal resolution, and log files which include outputs from the above model which provide information to a skilled user on the current compute stage of the model, data being processed and standard/non-standard exit.

Exemplary Aspects, Using a Cloud Computing Environment

Although this detailed description includes an exemplary embodiment of the present invention in a cloud computing environment, it is to be understood that implementation of the teachings recited herein are not limited to such a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client circuits through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 4, a schematic of an example of a cloud computing node is shown. Cloud computing node 10 is only one example of a suitable node and is not intended to suggest any limitation as to the scope of use or functionality of embodiments of the invention described herein. Regardless, cloud computing node 10 is capable of being implemented and/or performing any of the functionality set forth herein.

Although cloud computing node 10 is depicted as a computer system/server 12, it is understood to be operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop circuits, multiprocessor systems, microprocessor-based systems, set top boxes, programmable consumer electronics, network PCs, minicomputer systems, mainframe computer systems, and distributed cloud computing environments that include any of the above systems or circuits, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing circuits that are linked through a communications network. In a distributed cloud computing environment, program modules may be located in both local and remote computer system storage media including memory storage circuits.

Referring now to FIG. 4, a computer system/server 12 is shown in the form of a general-purpose computing circuit. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further described below, memory 28 may include a computer program product storing one or program modules 42 comprising computer readable instructions configured to carry out one or more features of the present invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may be adapted for implementation in a networking environment. In some embodiments, program modules 42 are adapted to generally carry out one or more functions and/or methodologies of the present invention.

Computer system/server 12 may also communicate with one or more external devices 14 such as a keyboard, a pointing circuit, other peripherals, such as display 24, etc., and one or more components that facilitate interaction with computer system/server 12. Such communication can occur via Input/Output (I/O) interface 22, and/or any circuits (e.g., network card, modem, etc.) that enable computer system/server 12 to communicate with one or more other computing circuits. For example, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, circuit drivers, redundant processing units, external disk drive arrays, RAID systems, tape drives, and data archival storage systems, etc.

Figure 5:
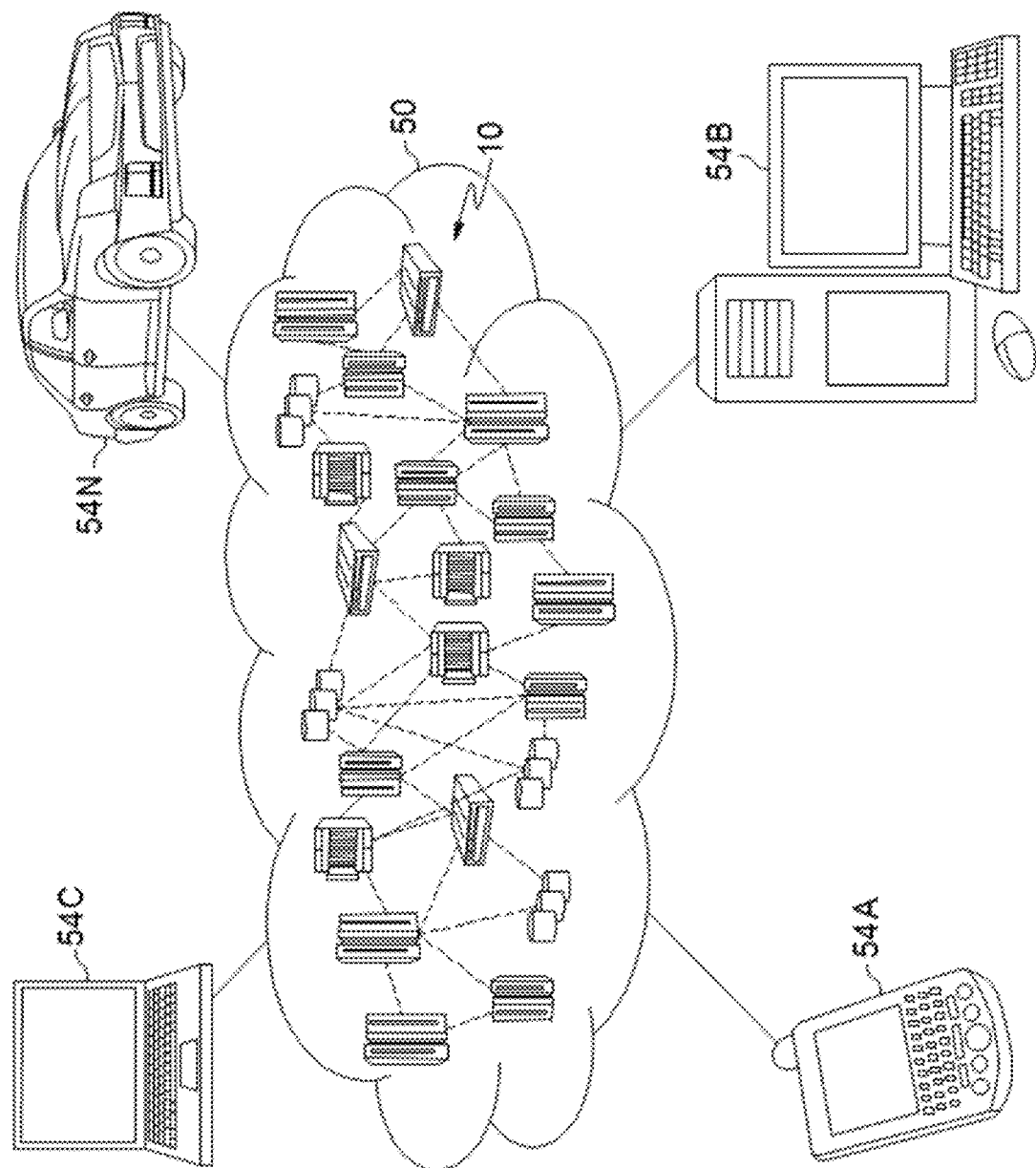
FIG. 5 depicts a cloud-computing environment 50 according to an embodiment of the present invention.

Referring now to FIG. 5, illustrative cloud computing environment 50 is depicted. As shown, cloud computing environment 50 comprises one or more cloud computing nodes 10 with which local computing circuits used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing circuit. It is understood that the types of computing circuits 54A-N shown in FIG. 5 are intended to be illustrative only and that computing nodes 10 and cloud computing environment 50 can communicate with any type of computerized circuit over any type of network and/or network addressable connection (e.g., using a web browser).

Figure 6:
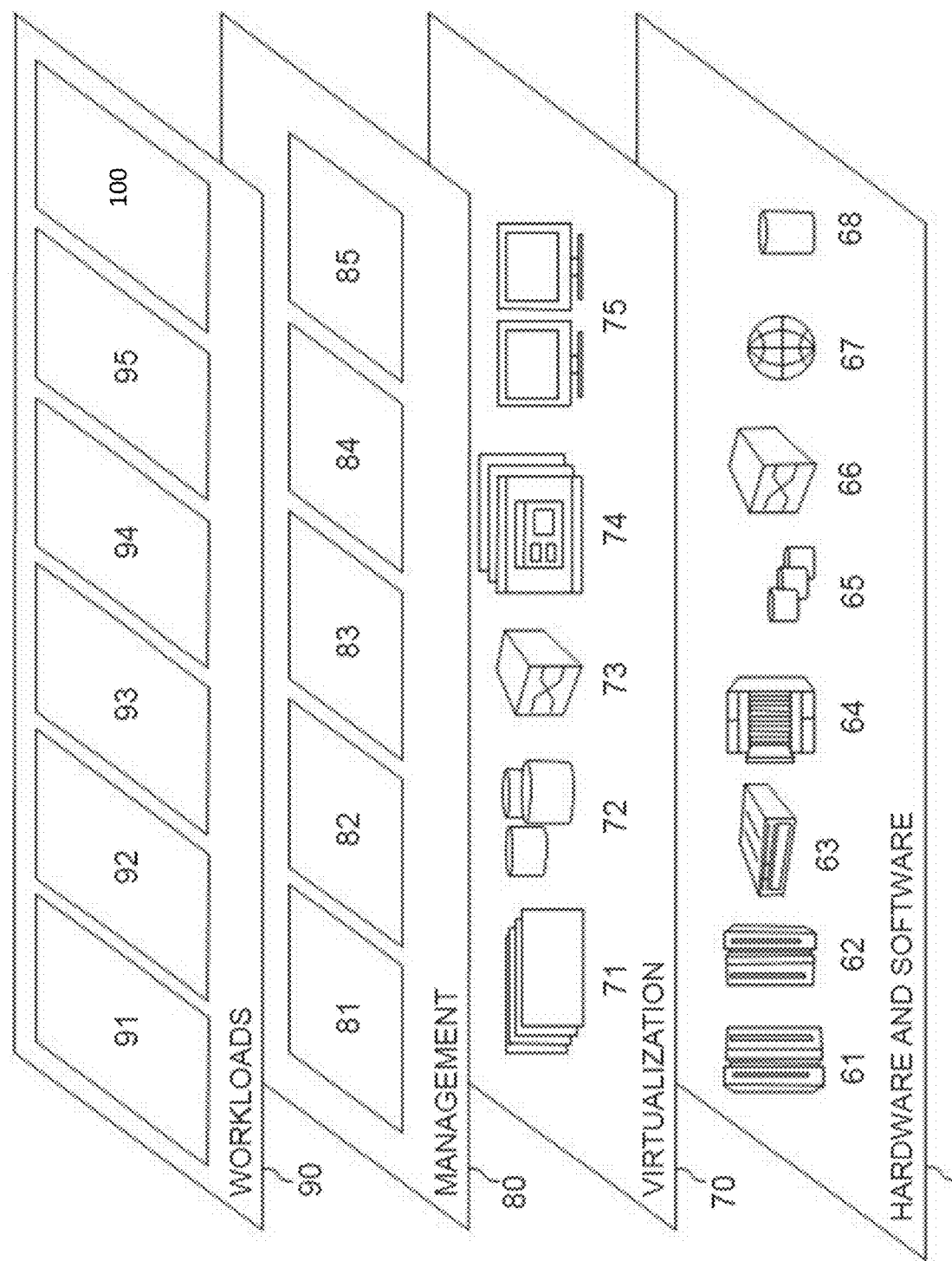
FIG. 6 depicts abstraction model layers according to an embodiment of the present invention.

Referring now to FIG. 6, an exemplary set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage circuits 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and simulation model recovery method 100 in accordance with the present invention.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A computer-implemented simulation model recovery method, the method comprising:
    during an operation of a model, periodically writing a solution space of the model to a checkpoint restart file;
    during an operation of the model, periodically writing diagnostic information on model progression to a log file;
    detecting a failure of the model;
    based on the log file of the model, determining a time of the failure;
    based on the model outputs and restart files, determining a period of a numerical instability preceding the failure;
    selecting a checkpoint of the model preceding the period of the numerical instability;
    based on the numerical instability and diagnostic information in log files, modifying a configuration of the model; and
    restarting the model based on the selected checkpoint and the modified configuration.

2. The computer-implemented method of claim 1, further comprising initiating a simulation model,
    wherein the failure comprises an unplanned termination of execution of the model.

3. The computer-implemented method of claim 1, wherein the configuration of the model comprises reducing a time step and a smooth forcing function.

4. The computer-implemented method of claim 1, further comprising taking as an input of an input/output of the model, a user directive on model stability sensitivity and a statistical metric summarizing model evolution, and
    wherein the restarting includes an autonomous restart and reconfiguration of the model by parsing information from the log and the input.

5. The computer-implemented method of claim 1, wherein the restarting uses periodic writes of a solution state to a file to allow for restarting the model at periodic intervals.

6. The computer-implemented method of claim 1, wherein the determining uses text mining and relation extraction tool to analyze the log file and identify the failure including a failure code and a description of the failure code.

7. The computer-implemented method of claim 6, wherein the description is related to a cause of the failure.

8. The computer-implemented method of claim 7, further comprising storing the associated failure classification and the cause of the failure in a database.

9. The computer-implemented method of claim 1, wherein a machine learning technique is applied to learn and extract a pattern related to the failure and a cause of the failure.

10. The computer-implemented method of claim 1, wherein a user-defined directive is implemented to amend the configuration of the model and input a file of the model based on information extracted from the log file and an output file of the model.

11. The computer-implemented method of claim 1, wherein a user-defined heuristic is implemented to have a non-linear and an incremental amendment of an input file in a case of repeated model instability.

12. The computer-implemented method of claim 1, further comprising providing an online monitoring of an output file of the model to quantify a numerical stability of a current simulation and return the configuration and an input file to an original value if a stability metric is within a defined threshold.

13. The computer-implemented method of claim 1, embodied in a cloud-computing environment.

14. A simulation model recovery computer program product, the computer program product comprising a computer-readable storage medium having program instructions embodied therewith, the program instructions executable by a computer to cause the computer to perform:
  during an operation of a model, periodically writing a solution space of the model to a checkpoint restart file;
  during an operation of the model, periodically writing diagnostic information on model progression to a log file;
  detecting a failure of the model;
  based on the log file of the model, determining a time of the failure;
  based on the model outputs and restart files, determining a period of a numerical instability preceding the failure;
  selecting a checkpoint of the model preceding the period of the numerical instability;
  based on the numerical instability and diagnostic information in log files, modifying a configuration of the model; and
  restarting the model based on the selected checkpoint and the modified configuration.

15. The computer program product of claim 14, further comprising initiating a simulation model,
  wherein the failure comprises an unplanned termination of execution of the model.

16. The computer program product of claim 14, wherein the configuration of the model comprises reducing a time step and a smooth forcing function.

17. The computer program product of claim 14, further comprising taking as an input of an input/output of the model, a user directive on model stability sensitivity and a statistical metric summarizing model evolution, and
  wherein the restarting includes an autonomous restart and reconfiguration of the model by parsing information from the log file and the input.

18. The computer program product of claim 14, wherein the restarting uses periodic writes of a solution state to a file to allow for restarting the model at periodic intervals.

19. A simulation model recovery system, the system comprising:
  a processor; and
  a memory, the memory storing instructions to cause the processor to perform:
    during an operation of a model, periodically writing a solution space of the model to a checkpoint restart file;
    during an operation of the model, periodically writing diagnostic information on model progression to a log file; and
    based on the log file of the model, determining a time of the failure,
  wherein the log file is analyzed to extract from the log file information related to a cause of the model crash using a model exit characterization component that collates the information on the failure, and
  wherein a lexical matching is conducted via the model exit characterization component to match an exit code from the log file information and a description of the model crash.

20. The system of claim 19, embodied in a cloud-computing environment,
  further comprising taking as an input of an input/output of the model, a user directive on model stability sensitivity and a statistical metric summarizing model evolution; and
  restarting the model based on a selected checkpoint and a modified configuration,
  wherein the restarting includes an autonomous restart and reconfiguration of the model by parsing information from the log file and the input.

* * * * *